(12) United States Patent
Kishimoto et al.

(10) Patent No.: US 10,944,074 B2
(45) Date of Patent: Mar. 9, 2021

(54) ORGANIC ELECTROLUMINESCENT DISPLAY DEVICE AND METHOD FOR PRODUCING SAME

(71) Applicant: SAKAI DISPLAY PRODUCTS CORPORATION, Sakai (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/610,627

(22) PCT Filed: Dec. 26, 2017

(86) PCT No.: PCT/JP2017/046683
§ 371 (c)(1),
(2) Date: Feb. 21, 2020

(87) PCT Pub. No.: WO2019/130431
PCT Pub. Date: Jul. 4, 2019

(65) Prior Publication Data
US 2020/0335720 A1 Oct. 22, 2020

(51) Int. Cl.
*H01L 51/52* (2006.01)
*H01L 27/32* (2006.01)
(Continued)

(52) U.S. Cl.
CPC ........ *H01L 51/5253* (2013.01); *H01L 27/323* (2013.01); *H01L 27/3246* (2013.01);
(Continued)

(58) Field of Classification Search
CPC ... H01L 27/323; H01L 51/50; H01L 51/5253; H01L 51/56
See application file for complete search history.

(56) References Cited

U.S. PATENT DOCUMENTS

| 2009/0058294 A1 | 3/2009 | Joo et al. |
| 2009/0174832 A1* | 7/2009 | Lee ......... G06F 3/045 349/43 |

(Continued)

FOREIGN PATENT DOCUMENTS

| CN | 103824876 A | 5/2014 |
| CN | 104360784 A | 2/2015 |

(Continued)

*Primary Examiner* — Zandra V Smith
*Assistant Examiner* — John M Parker
(74) *Attorney, Agent, or Firm* — ScienBiziP, P.C.

(57) ABSTRACT

This organic EL display device (100) has multiple pixels, and comprises: an element substrate (1) which has a substrate and multiple organic EL elements supported on the substrate and arranged in each of the multiple pixels; and a thin-film sealing structure (10) covering the multiple pixels. The thin-film sealing structure has a first inorganic barrier layer (12) and an organic barrier layer (14) contacting the upper surface or the lower surface of the first inorganic barrier layer. The element substrate further has a bank layer (33) defining each of the multiple pixels and multiple spacers (31) arranged in the gaps between the pixels, and the multiple spacers (31) are covered by the bank layer (33).

13 Claims, 7 Drawing Sheets

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 2227/323* (2013.01); *H01L 2251/301* (2013.01)

(56) References Cited

U.S. PATENT DOCUMENTS

| | | |
|---|---|---|
| 2013/0228754 A1 | 9/2013 | Park |
| 2014/0239265 A1 | 8/2014 | Kim |
| 2015/0076464 A1 | 3/2015 | Sakaguchi |
| 2015/0268504 A1* | 9/2015 | Kobayashi .......... G02F 1/13394 349/138 |
| 2016/0043346 A1 | 2/2016 | Kamiya et al. |
| 2016/0126495 A1 | 5/2016 | Oka et al. |
| 2017/0133443 A1 | 5/2017 | Nendai |

FOREIGN PATENT DOCUMENTS

| | | |
|---|---|---|
| JP | 2016-039120 A | 3/2016 |
| JP | 2017-063064 A | 3/2017 |
| JP | 2017-091802 A | 5/2017 |
| KR | 2010-0125502 A | 12/2010 |
| KR | 2011-0071646 A | 6/2011 |
| WO | 2013/146583 A1 | 10/2013 |
| WO | 2014/196137 A1 | 12/2014 |

* cited by examiner (a)

(b)

(a)

(b)

(a)

(b)

(a)

(b)

ORGANIC ELECTROLUMINESCENT DISPLAY DEVICE AND METHOD FOR PRODUCING SAME

TECHNICAL FIELD

The present invention relates to an organic EL display device and a method for producing the same.

BACKGROUND ART

Organic EL (Electroluminescence) display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficiently high level of water vapor barrier property. From the point of view of the moisture-resistance reliability of the OLED display device, such a thin film encapsulation structure is typically required to have a WVTR (Water Vapor Transmission Rate) lower than, or equal to, $1\times10^{-4}$ g/m$^2$/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem that the bendability of the OLED display device is limited.

Patent Documents Nos. 1 and 2 each describe a thin film encapsulation structure including an organic barrier layer formed of a resin located locally. The thin film encapsulation structure described in Patent Document No. 1 or 2 does not include a thick organic barrier layer. Therefore, use of the thin film encapsulation structure described in Patent Document No. 1 or 2 is considered to improve the bendability of the OLED display device.

Patent Document No. 1 discloses a thin film encapsulation structure including a first inorganic material layer (first inorganic barrier layer), a first resin member and a second inorganic material layer (second inorganic barrier layer) provided on the element substrate in this order, with the first inorganic material layer being closest to the element substrate. In this thin film encapsulation structure, the first resin member is present locally, more specifically, in the vicinity of a protruding portion of the first inorganic material layer (first inorganic material layer covering the protruding portion). According to Patent Document No. 1, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic barrier layer and a surface of the substrate. Then, the organic material is cured to form the first resin member at the border. Patent Document No. 2 also discloses an OLED display device including a similar thin film encapsulation structure.

CITATION LIST

Patent Literature

Patent Document No. 1: WO2014/196137
Patent Document No. 2: Japanese Laid-Open Patent Publication No. 2016-39120

SUMMARY OF INVENTION

Technical Problem

However, studies made by the present inventors have found that an OLED display device having a thin film encapsulation structure involves a problem that a display fault is caused by a local external force. This problem is considered to be caused because when, for example, a display plane of the OLED display device is pressed with a finger to apply a local external force to the OLED display device, a plurality of layers included in an organic EL element (e.g., an electrode and an organic layer, and/or a light emitting layer and a charge transfer layer included in the organic layer) are delaminated from each other. In, for example, an OLED display device including a touch sensor layer, when the display plane is pressed with a strong force, an adhesive layer between the touch sensor layer and an OLED element is deformed, and as a result, a recessed portion (thin portion) is formed in the adhesive layer. When this occurs, the adhesive layer cannot absorb/disperse the external force received by the touch sensor layer, and therefore, the external force is directly transmitted to the OLED element. This is considered to cause the display fault. It has been found that such a display fault easily occurs in a peripheral region in a display region (the peripheral region will be referred to as a "peripheral display region"). A conceived reason for this is that the OLED display panel is secured to a frame of a casing and therefore, the peripheral region is influenced by a stress caused by the external force.

This problem easily occurs in an OLED display device, commercially available currently, including a thin film encapsulation structure that includes a relatively thick organic barrier layer acting also as a flattening layer. This problem is considered to be caused for the following reasons. In the case where a thin film encapsulation structure including a relatively thick flattening layer is adopted, a relatively thin adhesive layer is used in order to suppress an increase in the overall thickness of the OLED display device. In addition, in the display region, the flattening layer easily becomes thicker in the peripheral display region, more specifically, in a region from an end area to a slightly inner area thereto, than in a central display region, and as a result, the adhesive layer becomes still thinner in the vicinity of the peripheral display region. Needless to say, a similar problem may possibly occur to an OLED display device, produced by the method described in Patent Document No. 1 or 2, including a thin film encapsulation structure that includes an organic barrier layer formed of a resin located locally (may be referred to as a "solid portion").

The present invention made to solve the above-described problems has an object of providing an organic EL display device including a thin film encapsulation structure and suppressing a display fault from being caused by an external force, and a method for producing the same.

Solution to Problem

An organic EL display device according to an embodiment of the present invention is an organic EL display device including a plurality of pixels. The organic EL display device includes an element substrate including a substrate, and a plurality of organic EL elements supported by the substrate and respectively located in the plurality of pixels; and a thin film encapsulation structure covering the plurality of pixels. The thin film encapsulation structure includes a first inorganic barrier layer and an organic barrier layer in contact with a top surface or a bottom, surface of the first inorganic barrier layer. The element substrate further includes a bank layer defining each of the plurality of pixels, and a plurality of spacers located in gaps between the plurality of pixels. The plurality of spacers are covered with the bank layer.

In an embodiment, the plurality of spacers are located at a higher density in a peripheral display region in a display region, in which the plurality of pixels are arrayed, than in a central display region in the display region.

In an embodiment, the plurality of spacers are located in the peripheral display region at a density that is at least twice the density in the central display region.

In an embodiment, the plurality of spacers have a height greater than a thickness of the bank layer.

In an embodiment, the plurality of spacers each have a circle equivalent diameter of 5 μm or greater and 30 μm or less as seen in a direction of normal to the substrate.

In an embodiment, the organic barrier layer included in the thin film encapsulation structure is in contact with the top surface of the first inorganic barrier layer and includes a plurality of solid portions discretely distributed, and the thin film encapsulation structure further includes a second inorganic barrier layer in contact with the top surface of the first inorganic barrier layer and top surfaces of the plurality of solid portions of the organic barrier layer.

In an embodiment, the organic barrier layer included in the thin film encapsulation structure is in contact with the bottom surface of the first inorganic barrier layer and acts also as a flattening layer having a thickness of 5 μm or greater.

In an embodiment, the organic EL display device further includes a touch sensor layer provided on the thin film encapsulation structure.

In an embodiment, the touch sensor layer includes a metal mesh layer, and the plurality of spacers each have a circle equivalent diameter that is shorter than a minimum unit of the metal mesh layer.

In an embodiment, the substrate is a flexible substrate.

In an embodiment, the peripheral display region has a width that is 5% or greater and 15% or less of a length of the display region in a corresponding direction.

In an embodiment, the plurality of pixels are arrayed in a number of 50 or larger and 200 or smaller in a width direction of the peripheral display region.

A method for producing an organic EL display device according to an embodiment of the present invention is a method for producing the organic EL display device described in any one of the above. The method includes step A of forming the plurality of spacers of a photocurable resin; a step of, after the step A, providing a liquid-state photosensitive resin material such that the liquid-state photosensitive resin material covers the plurality of spacers; and a step of patterning the photosensitive resin material by a photolithography pattern to form the bank layer.

In an embodiment, the photosensitive resin material contains an acrylic resin or a polyamide resin.

Advantageous Effects of Invention

An embodiment of the present invention provides an organic EL display device including a thin film encapsulation structure and suppressing a display fault from being caused by an external force, and a method for producing the same.

BRIEF DESCRIPTION OF DRAWINGS

FIG. 3(a) shows a central display region R1c, and FIG. 3(b) shows a peripheral display region R1p.

DESCRIPTION OF EMBODIMENTS

Hereinafter, an organic EL display device and a method for producing the same according to embodiments of the present invention will be described with reference to the drawings. Herein, embodiments of the present invention will be described by way of a flexible OLED display device including a touch sensor layer. The embodiments of the present invention are not limited to the embodiments described below as examples. Namely, the organic EL display device according to embodiments of the present invention does not need to include a touch sensor layer, and may include, for example, a glass substrate instead of a flexible substrate.

Figure 1:
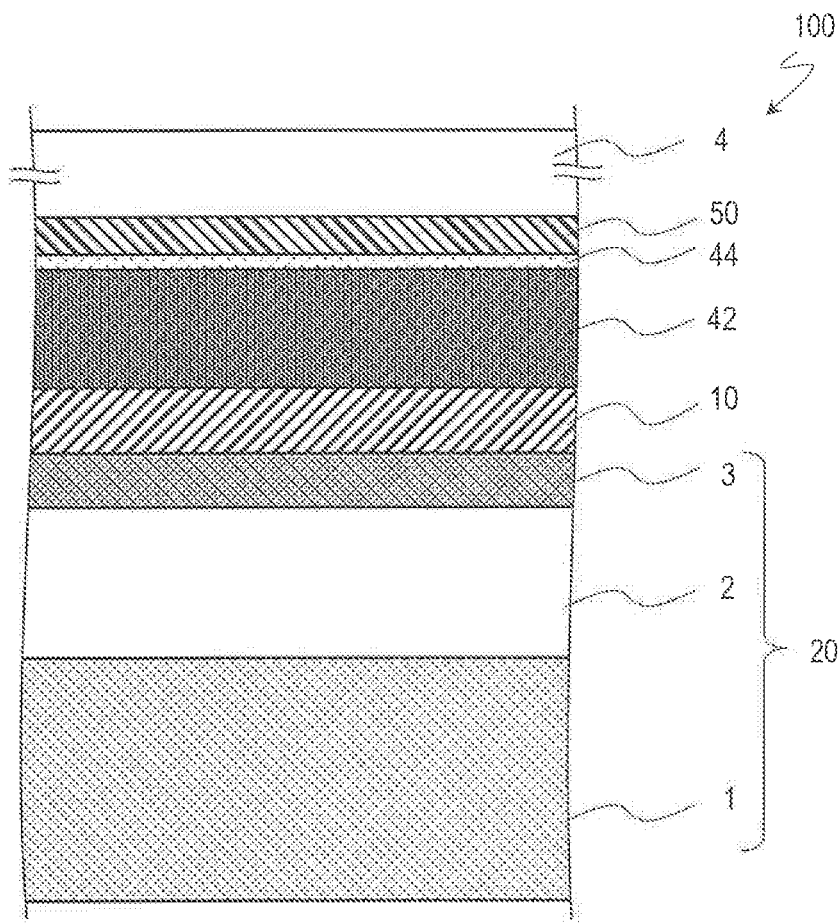
FIG. 1(a) is a schematic partial cross-sectional view of an active region of an OLED display device 100 according to an embodiment of the present invention.
FIG. 1(b) is a partial cross-sectional view of a TFE structure 10 formed on an OLED 3.
Figure 1:
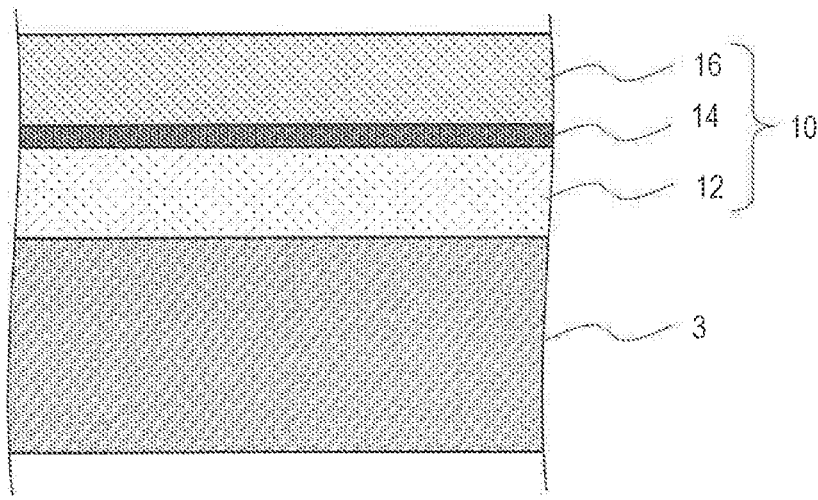

With reference to FIG. 1(a) and FIG. 1(b), a basic structure of an OLED display device 100 according to an embodiment, of the present invention will be described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3. An active region (R1 in FIG. 2) may be referred to as a "display region".

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a flexible substrate (hereinafter, may be referred to simply as a "substrate") 1, a circuit (back plane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, a top electrode or a cap layer (refractive index adjusting layer). The OLED display device 100 further includes an adhesive layer 42 provided on the thin film encapsulation structure 10, an inorganic insulating layer 44 covering the adhesive layer 42, and a touch sensor layer 50 located on the inorganic insulating layer 44. The adhesive layer 42 is, for example, a pressure-sensitive adhesive layer. The inorganic insulating layer 44 may be omitted.

An optional polarizing plate 4 may be located on the touch sensor layer 50. The polarizing plate 4 may be located between the TFE structure 10 and the touch sensor layer 50 (e.g., between the adhesive layer 42 and the touch sensor layer 50). The polarizing plate 4 is a circularly polarizing plate (stack body of & linearly polarizing plate and a λ/4 plate), and plays a role of preventing reflection as is well known. From the point of view of preventing reflection, it is preferred that the polarizing plate 4 is located on the touch sensor layer 50 as shown in the figure.

The substrate 1 is, for example, a polyimide film having a thickness of 15 μm. The circuit 2 including the TFT has a thickness of, for example, 4 μm. The OLED 3 has a thickness of, for example, 1 μm. The TFE structure 10 has a thickness of, for example, 1.5 μm or less. The adhesive layer 42 has a thickness of, for example, 10 μm or greater and 30 μm or less, preferably 25 μm or less. The inorganic insulating layer 44 is, for example, an SiN layer (e.g., $Si_3N_4$ layer). The SiN layer has a thickness of, for example, 200 nm or greater and 1000 nm or less.

FIG. 1(b) is a partial cross-sectional view of the TFE structure 10 formed on the OLED 3. A first inorganic barrier layer (e.g., SiN layer) 12 is formed immediately on the OLED 3, an organic barrier layer (e.g., acrylic resin layer) 14 is formed on the first inorganic barrier layer 12, and a second inorganic barrier layer (e.g., SiN layer) 16 is formed on the organic barrier layer 14.

The organic barrier layer 14 includes a plurality of solid portions that, are in contact with a top surface of the first inorganic barrier, layer 12 and distributed discretely. A "solid portion" refers to a portion, of the organic barrier layer 14, where an organic film (e.g., photocured resin film) is actually present. By contrast, a portion, of the organic barrier layer 14, where the organic film is absent is referred to as a "non-solid portion". The non-solid portion enclosed by the solid portion may also be referred to as an "opening". The second inorganic barrier layer 16 is in contact with the top surface of the first inorganic barrier layer 12 and top surfaces of the plurality of solid portions of the organic barrier layer 14. Namely, the second inorganic barrier layer 16 is in direct contact with the first inorganic barrier layer 12 in the non-solid portion of the organic barrier layer 14.

The TFE structure 10 is formed to protect the active region (see the active region R1 in FIG. 2) of the OLED display device 100. The non-solid portion of the organic barrier layer 14 includes at least a continuous portion provided to enclose the active region R1, and the active region R1 is completely enclosed by the portion in which the first inorganic barrier layer 12 and the second inorganic barrier layer 16 are in direct contact with each other (hereinafter, such a portion will be referred to as an "inorganic barrier layer joint portion"). Therefore, the solid portions of the organic barrier layer 14 do net act as a route for moisture.

For example, the first inorganic barrier layer 12 and the second inorganic barrier layer 16 are each an SiN layer having a thickness of, for example, 400 nm, and the organic barrier layer 14 is an acrylic resin layer having a thickness that is, for example, less than 100 nm.

The thicknesses of the first inorganic barrier layer 12 and the second inorganic barrier, layer 16 are each independently 200 nm or greater and 1500 nm or less, and preferably 1000 nm. The thickness of the organic barrier layer 14 is, for example, 10 nm or greater and less than 500 nm, and preferably 50 nm or greater and less than 300 nm. In the case where the thickness of the organic barrier layer 14 is less than 10 nm, the effect of the organic barrier layer 14 may not be fully provided. By contrast, in the case where the thickness of the organic barrier layer 14 is 500 nm or greater, the effect of the organic barrier layer 14 is saturated while the production cost is increased.

The "thickness" of the organic barrier layer 14 refers to a thickness of a flat portion thereof. A liquid film of a photocurable resin used to form the organic barrier layer 14 forms a flat (horizontal) surface. Therefore, in the case where the underlying layer includes a recessed portion, the thickness of the liquid film is increased in such a region. The liquid film forms a curved surface by a surface tension (encompassing a capillary phenomenon). Therefore, the thickness of the liquid film in the vicinity of a protruding portion of the curved surface is increased. Such a locally thick portion may have a thickness exceeding 500 nm.

The thickness of the TFE structure 10 is preferably 400 nm or greater and less than 2 μm, and more preferably 400 nm or greater and less than 1.5 μm.

The above-described TFE structure 10 including the relatively thin organic barrier layer may be replaced with a TFE structure including a relatively thick organic barrier layer, having a thickness of 5 μm or greater and acting also as a flattening layer, in contact with a bottom surface of the first inorganic barrier layer. Needless to say, an inorganic barrier layer may further be provided in contact with a bottom surface of the organic barrier layer (namely, the relatively thin organic barrier layer in the above-described TFE structure 10 may be replaced with a relatively thick organic barrier layer). In this case, it is preferred that the organic barrier layer has a thickness of 5 µm or greater and 20 µm or less in the case of being formed by, for example, a common inkjet method. With the inkjet method, it is difficult to form an organic barrier layer having a uniform thickness less than 5 µm. By contrast, in the case where the thickness of the organic barrier layer exceeds 20 µm, the costly material is consumed in a large amount and thus the production cost is increased. Or, in the case where the organic insulating layer is so thick, a component (dam) that keeps an organic material, provided by the inkjet method, at a predetermined position needs to be made high. This complicates the production process.

In an OLED display device including a TFE structure including a relatively thick organic barrier layer, a display fault easily occurs in the peripheral display region as described above. As described above, this is considered to be caused because a relatively thin adhesive layer is used, and also because in the display region, the flattening layer easily becomes thicker in the peripheral display region, more specifically, in a region from an end area to a slightly inner area thereto, than in the central display region, and as a result, the adhesive layer becomes still thinner in the vicinity of the peripheral display region. This will be described below more specifically.

The relatively thick organic barrier layer formed by an inkjet method and acting also as a flattening layer easily becomes thicker in the peripheral display region than in the central display region. In the case where a touch sensor layer is bonded on such a flattening layer by use of a completely flat stage, the adhesive layer located on the flattening layer in the peripheral display region is considered to be deformed (thinned). The adhesive layer, when being thin, cannot absorb/disperse the external force received by the touch sensor layer, and therefore, the external force is directly transmitted to the OLED element. This is considered to cause the display fault. In addition, the OLED display panel is secured to the frame of the casing, and as a result, the adhesive layer becomes thinner in the peripheral display region than in the central display region. This is also considered to cause the display fault.

Figure 2:
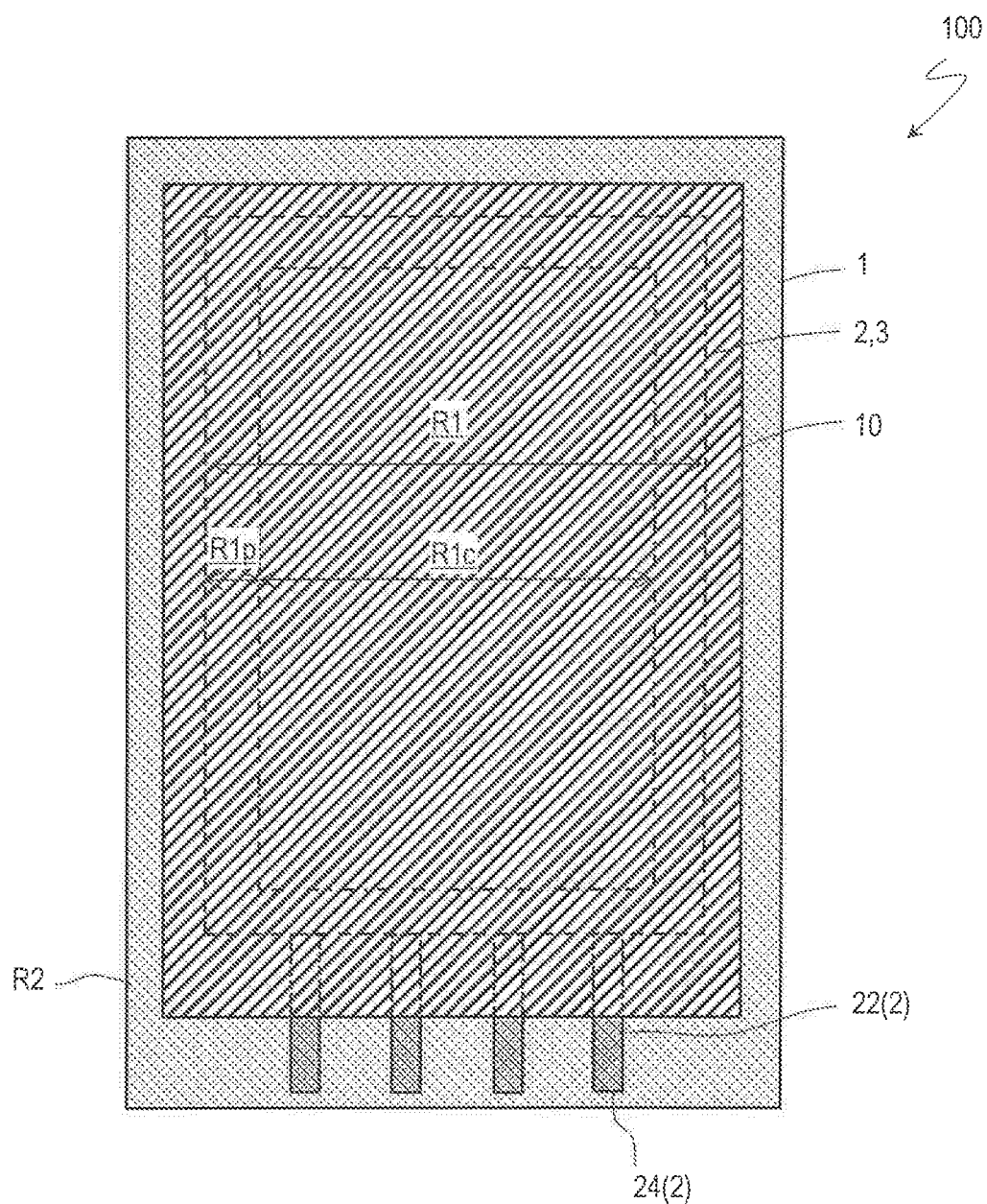
FIG. 2 is a plan view schematically showing a structure of the OLED display device 100 (TFE structure 10 and components below the TFE structure 10) according to an embodiment of the present invention.

Now, FIG. 2 will be referred to. FIG. 2 is a plan view schematically showing the structure of the OLED display device 100 (the TFE structure 10 and components below the TFE structure 10) according to an embodiment of the present invention.

The circuit 2 formed on the substrate 1 includes a plurality of the TFTs (not shown), and a plurality of gate bus lines (not shown) and a plurality of source bus lines (not shown) each connected to either one of the plurality of TFTs (not shown). The circuit 2 may be a known circuit that drives a plurality of the OLEDs 3. The plurality of OLEDs 3 are each connected with either one of the plurality of TFTs included in the circuit 2. The OLEDs 3 may be known OLEDs.

The circuit 2 further includes a plurality of terminals 24 located in a peripheral region R2 outer to the active region (region enclosed by the dashed line in FIG. 2) R1, where the plurality of OLEDs 3 are located, and also includes a plurality of lead wires 22 each connecting either one of the plurality of terminals 24 and either one of the plurality of gate bus lines or either one of the plurality of source bus lines to each other. The entirety of the circuit 2 including the plurality of TFTs, the plurality of gate bus lines, the plurality of source bus lines, the plurality of lead wires 22 and the plurality of terminals 24 may be referred to as a "driving circuit layer 2".

In FIG. 2 and the like, only the lead wires 22 and/or the terminals 24 may be shown as components of the driving circuit layer 2. Nonetheless, the driving circuit layer 2 includes a conductive layer including the lead wires 22 and the terminals 24 and further includes at least one conductive layer, at least one insulating layer, and at least one semiconductor layer. An insulating film (base coat) may be formed on the substrate 1 as an underlying layer for the driving circuit layer 2.

The TFE structure 10 is formed to protect the active region R1. The first inorganic barrier layer 12 and the second inorganic barrier layer 16 are each, for example, an SiN layer, and are selectively formed only in a predetermined region, by plasma CVD by use of a mask, so as to cover the active region R1. In this example, the first inorganic barrier layer 12 and the second inorganic barrier layer 16 are independently and selectively formed on the active region R1 and portions, of the plurality of lead wires 22, that are closer to the active region R1. From the point of view of reliability, it is preferred that the second inorganic barrier layer 16 is formed in the same region as that of the first inorganic barrier layer 12 (formed such that the second inorganic barrier layer 16 and the first inorganic barrier layer 12 have matching outer edges) or is formed so as to cover the entirety of the first inorganic barrier layer 12. The active region R1 is enclosed by the inorganic barrier layer joint portion, where the first inorganic barrier layer 12 and the second inorganic barrier layer 16 are in direct contact with each other.

The organic barrier layer 14 may be formed by, for example, the method described in Patent Document No. 1 or 2 mentioned above. For example, in a chamber, a vapor-like or mist-like organic material (e.g., acrylic monomer) is supplied onto an element substrate maintained at a temperature lower than, or equal to, room temperature and is condensed on the element substrate. The organic material put into a liquid state is located locally, more specifically, at a border between a side surface of a protruding portion of, and a flat portion of, the first inorganic barrier layer 12 by a capillary action or a surface tension of the organic material. Then, the organic material is irradiated with, for example, ultraviolet rays to form a solid portion of the organic barrier layer (e.g., acrylic resin layer) 14 at the above-mentioned border in the vicinity of the protruding portion. The organic barrier layer 14 formed by this method does not substantially include the solid portion on the flat portion. Regarding the method for forming the organic barrier layer, the disclosures of Patent Documents Nos. 1 and 2 are incorporated herein by reference.

Alternatively, the organic barrier layer 14 may be formed by adjusting an initial thickness of the resin layer (e.g., to less than 100 nm) and/or by ashing the resin layer once formed. The ashing may be performed by plasma ashing using, for example, at least one type of gas among $N_2O$, $O_2$ and $O_3$.

In the above, a method for forming the TFE structure 10 including the relatively thin organic barrier layer 14 is described. Alternatively, as described above, a TFE structure including a relatively thick organic barrier layer having a thickness of 5 µm or greater and acting also as a flattening layer may be formed by use of, for example, an inkjet method.

As described below with reference to FIGS. 3(a) and 3(b) through FIG. 7, in the OLED display device 100 according to an embodiment of the present invention, the element substrate includes a bank layer (may also be referred to as a "PDL (Pixel Defining Layer)") defining each of the plurality of pixels, and a plurality of spacers located in gaps between the plurality of pixels. The plurality of spacers are covered with the bank layer. The bank layer is formed to cover two or more of the spacers, and may be formed to be continuous in the entirety of the display region R1. The plurality of spacers located in the gaps between the plurality of pixels are covered with the bank layer defining each of the plurality of pixels (see FIG. 3(a) or FIG. 3(b)).

In an embodiment, the plurality of spacers are located at a higher density in a peripheral display region R1p in the display region R1, in which the plurality of pixels are arrayed, than in a central display region R1c in the display region R1. It is preferred that as shown in FIG. 2, the peripheral display region R1p has a width that is 5% or greater and 15% or less of a length of the display region R1 in a corresponding direction. Namely, it is preferred that the width of the peripheral display region R1p in a horizontal direction is 5% or greater and 15% or less of the length of the display region R1 in the horizontal direction, and that the width of the peripheral display region R1p in a vertical direction is 5% or greater and 15% or less of the length of the display region R1 in the vertical direction. Alternatively, it is preferred that the pixels are arrayed in a number of 50 or larger and 200 or smaller in the peripheral display region R1p in width directions, namely, in both of the horizontal direction and the vertical direction. The number of the pixels arrayed in the width directions of the peripheral display region R1p may vary in accordance with the resolution of the display device. In the case of, for example, a display device having a WQHD resolution (2560 pixels×1440 pixels), the peripheral display region R1p is a range including 72 pixels to 216 pixels provided along the shorter-side direction from an outer edge of the display region R1.

FIG. 3(a) and FIG. 3(b) each shows an example of positional arrangement of the pixels (R, G, B) and spacers 31 of the OLED display device 100 according to an embodiment of the present invention. FIG. 3(a) shows an example of the positional arrangement of the pixels and the spacers 31 in the central display region R1c, and FIG. 3(b) shows an example of the positional arrangement of the pixels and the spacers 31 in the peripheral display region R1p.

Figure 3:
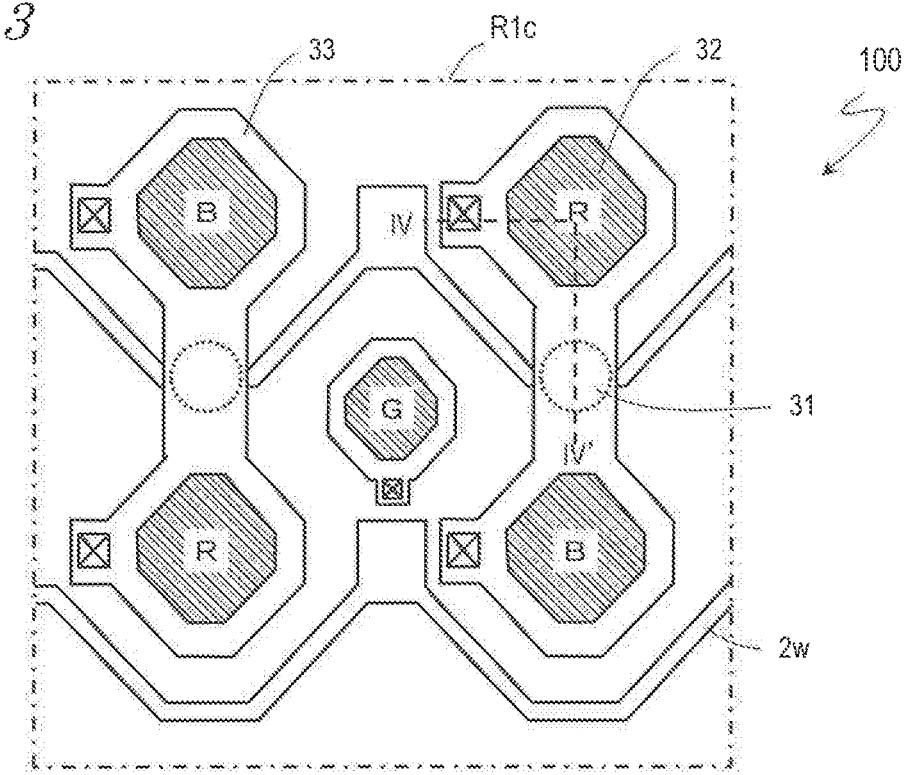
FIG. 3(a) and FIG. 3(b) provide schematic plan views showing an example of positional arrangement, of pixels and spacers in the OLED display device 100 according to an embodiment of the present invention.
Figure 3:
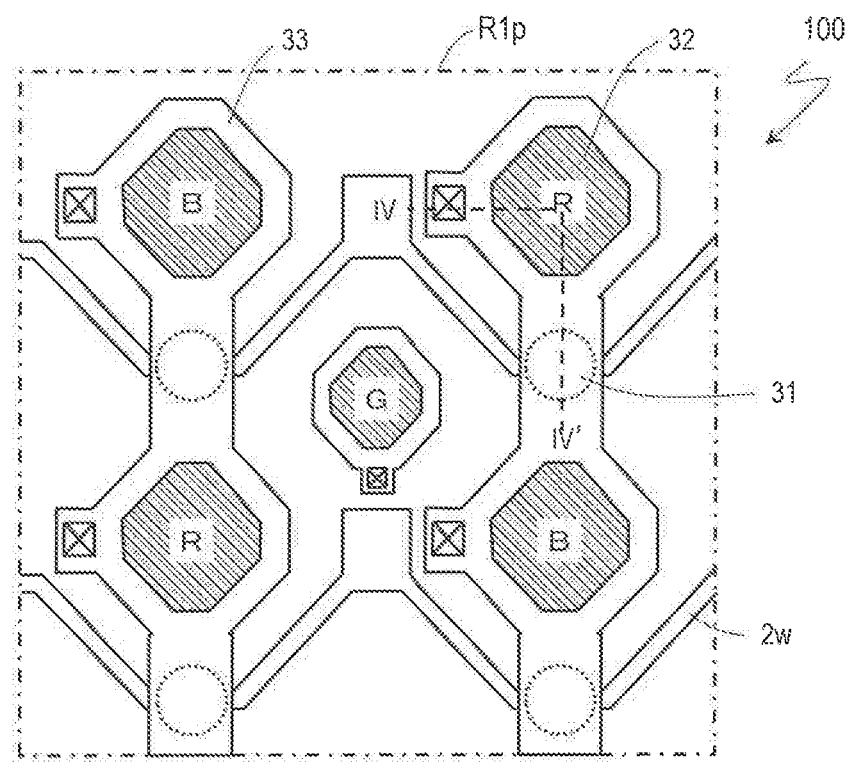

In this specification, a unit displaying each of the primary colors (e.g., red, green and blue) as shown in FIG. 3(a) or FIG. 3 (b) will be referred to as a "pixel". A color display unit including a plurality of primary color pixels will be referred to as a "color display pixel". A color display pixel includes, for example, three pixels of R, G and B (striped array) or four pixels of R, G, G and B (diamond pentile array). According to another known definition, the "pixel" in the sense of this specification is a "sub pixel", and the "color display pixel" in the sense of this specification is a "pixel".

In the examples shown in FIG. 3(a) and FIG. 3(b), the pixels are arranged in a diamond pentile array; namely, the R pixels and the B pixels are located to enclose the G pixel. A diamond pentile array by which the B pixels and the G pixels are located to enclose the R pixel is also known.

In the case of the diamond pentile array, it is preferred that the spacers 31 are located as follows. It is preferred that the spacers 31 each have an area size of about 50% to about 100% of the area size of the smallest pixel among the three pixels of R, G and B (the smallest pixel is the G pixel in the ease of FIG. 3(a) and FIG. 3(b)). It is preferred that the spacers 31 are located close to the two larger pixels (the R pixels and the B pixels in the case of FIG. 3(a) and FIG. 3(b)) (namely, it is preferred that the spacers 31 are located between these two larger pixels).

Regarding the density of the spacers 31, one spacer 31 is located for every four pixels in FIG. 3(a), whereas one spacer 31 is located for every two pixels in FIG. 3(b). Namely, the density of the spacers 31 in the peripheral display region R1p (FIG. 3(b)) is twice the density of the spacers 31 in the central display region R1c (FIG. 3(a)). As can be seen, in the OLED display device 100 according to an embodiment of the present invention, the spacers 31 are located at a higher density in the peripheral display region R1p than in the central display region R1c. The density of the spacers 31 in each of the peripheral display region R1p and the central display region R1c is appropriately set in accordance with the precision of the pixels, the use of the display device and the like. Typically, it is preferred that the density of the spacers 31 in the peripheral display region R1p is at least twice the density of the spacers 31 in the central display region R1c.

In the central display region R1c, the spacers 31 may be located at a density of one spacer 31 per color display pixel or a lower, density. Namely, one spacer 31 may be located for every two or more color display pixels. In such a case, the density of the spacers 31 in the peripheral display region R1p may be at least four times the density of the spacers 31 in the central display region R1c.

It is preferred that the spacers 31 each have a diameter (circle equivalent diameter as seen in a direction normal, to the substrate) of 5 μm or longer and 30 μm or shorter. It is preferred that the diameter of the spacer 31 is shorter than the distance between two adjacent pixels and does not influence the manner in which the bank layer 33 defines each of the pixels. It is preferred that the spacer 31 has a diameter of at least 5 μm in order to guarantee the tolerance thereof against a local external force. The ratio of the diameter with respect to the height of the spacer 31 (aspect ratio; height: diameter) is preferably about 1:2.

As seen in the direction normal to the substrate, the spacers 31 may each have a circular shape as shown in FIG. 3(a) or FIG. 3 (b). The spacers 31 are not limited to having such a shape, and may have any other shape. However, where the normal to the substrate is the axis of symmetry, it is preferred that the spacer 31 has at least four-fold rotational symmetry, for example, has a shape of a square, a regular hexagon, a regular octagon or a circle.

The positional arrangement of the pixels shown in FIG. 3(a) or FIG. 3(b) is a diamond pentile array. There is no specific limitation on the positional arrangement of the pixels of the organic EL display device according to an embodiment of the present invention. The pixels may be arranged in any known manner, for example, a diamond array, a striped array, a zigzag array or the like.

Now, FIG. 4 through FIG. 7 will be referred to.

Figure 4:
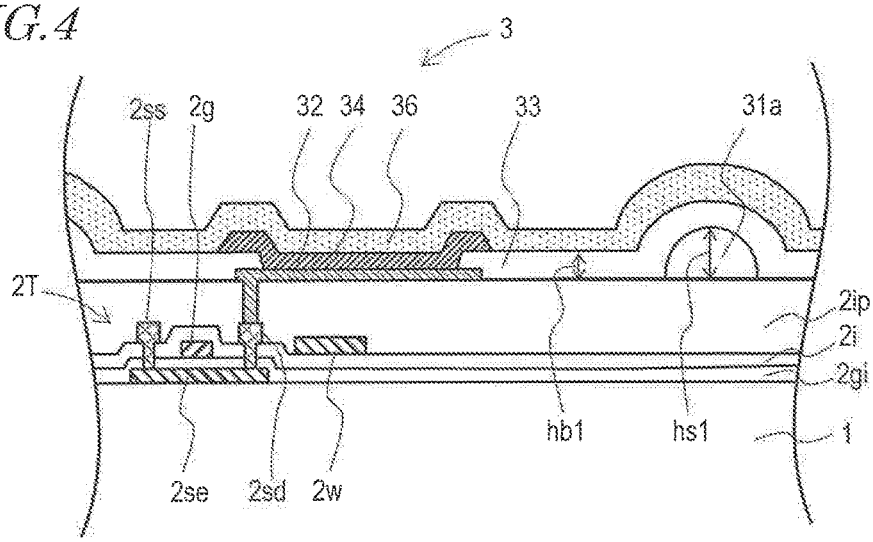
FIG. 4 is a schematic cross-sectional view taken along dashed line IV-IV' in FIG. 3(a) or FIG. 3(b).

FIG. 4 is a schematic cross-sectional view of the OLED display device 100 taken along dashed line IV-IV' in FIG. 3(a) or FIG. 3(b). FIG. 4 shows a TFT 2T included in a circuit (backplane) formed on the substrate 1, and the OLED 3 formed on the circuit.

In a high-definition small-to medium-sized OLED display device, the TFT 2T is preferably a low temperature polycrystalline silicon (referred to simply as "LTPS") TFT or an oxide TFT (e.g., a four-component (In—Ga—Zn—O-based) oxide TFT) containing In (indium), Ga (gallium), Zn (Zinc) and O (oxygen)), both of which have a high mobility. The structure of each of the LTPS-TFT and the In—Ga—Zn—O-based TFT is well known and thus will be described briefly below.

The TFT 2T may be included in the circuit 2 of the OLED display device 100. The LTPS-TFT 2T is of a top-gate type.

The TFT 2T is formed on the substrate (e.g., polyimide film) 1. It is preferred that a base coat formed of an inorganic insulating material is formed on the substrate 1 although the base coat is not shown in FIG. 4.

The TFT 2T includes a polycrystalline silicon layer 2se formed on the substrate 1 or the base coat, a gate insulating layer 2gi formed on the polycrystalline silicon layer 2se, a gate electrode 2g formed on the gate insulating layer 2gi, an interlayer insulating layer 2i formed on the gate electrode 2g, a no a source electrode 2ss and a drain electrode 2sd formed on the inter layer insulating layer 2i. The source electrode 2ss and the drain electrode 2sd are respectively connected with a source region and a drain region of the polycrystalline silicon layer 2se in contact holes formed in the interlayer insulating layer 2i and the gate insulating layer 2gi.

The gate electrode 2g is included in a gate metal layer that also includes the gate bus lines, and the source electrode 2ss and the drain electrode 2sd are included in a source metal layer that also includes the source bus lines. The gate metal layer and the source metal layer may be used to form the lead wires and the terminals.

The OLED 3 is formed on a flattening layer (e.g., organic resin layer) 2ip covering the above-listed components. The OLED 3 includes a bottom electrode 32, an organic layer 34 formed on the bottom electrode 32, and a top electrode 36 formed on the organic layer 34. In this example, the bottom electrode 32 and the top electrode 36 respectively form, for example, a positive electrode and a negative electrode. The top electrode 36 is a common electrode formed in the entirety of the plurality of pixels in the display region. By contrast, the bottom electrode (pixel electrode) 32 is formed in correspondence with each of the pixels.

The bottom electrode 32 is formed on the flattening layer 2ip, and is connected with the drain electrode 2sd in a through-hole formed in the flattening layer 2ip.

The bank layer 33 is formed between the bottom electrode 32 and the organic layer 34 so as to cover a peripheral portion of the bottom electrode 32. In the case where the bank layer 33 is present between the bottom electrode 32 and the organic layer 34, holes are not injected from the bottom electrode 32 into the organic layer 34. Therefore, a region where the bank layer 33 is present does not act as a pixel, and thus the bank layer 33 defines outer edges of the pixels.

A plurality of spacers 31a are located in gaps between the plurality of pixels, and are covered with the bank layer 33. The spacers 31a shown herein as an example each have a generally semicircular cross-section along a plane including the normal to the substrate 1.

Each of the spacers 31a has height hs1 of, for example, 2 µm or greater and 4 µm or less. The bank layer 33 has thickness hb1 of, for example, 1 µm or greater and 4 µm or less. It is preferred that the height hs1 of the spacer 31a is greater than the thickness hb1 of the bank layer 33.

It is preferred that the sum of the height hs1 of the spacer 31a and the thickness hb1 of the bank layer 33 is 4 µm or greater and 8 µm or less. In the case where the sum of hs1 and hb1 is less than this range, a sufficient tolerance against the external force may not be provided. In the case where the sum of hs1 and hb1 is greater than this range, the gap between a vapor deposition mask and the element substrate is too large and thus the precision of the vapor deposition pattern may possibly be declined. In the case where a vapor deposition method providing a high level of directivity is adopted, the precision of the vapor deposition pattern may be improved even if the sum of hs1 and hb1 is greater than 8 µm.

The above-described structure provides an advantage that the thickness (height) is controlled more accurately than in the case where another spacer having the thickness hb1 is formed on the spacers 31a located discretely. The structure also provides an advantage that the tolerance against the external force is high.

It is preferred that the spacers 31a are formed of a photocurable resin, for example, an ultraviolet-curable acrylic resin. The use of a photocurable resin provides a high size precision.

The bank layer 33 is formed as follows. A liquid-state photosensitive resin material is applied to cover the spacers 31a, and then the photosensitive resin material is patterned by a photolithography process. The photosensitive resin material preferably contains an acrylic resin or a polyamide resin. Polyimide is also usable.

The wettability of the photosensitive resin material to the spacers 31a or the viscosity of the photosensitive resin material may be controlled, so that the bank layer 33 having a thickness of 1 µm or greater and 4 µm or less is formed.

Figure 5:
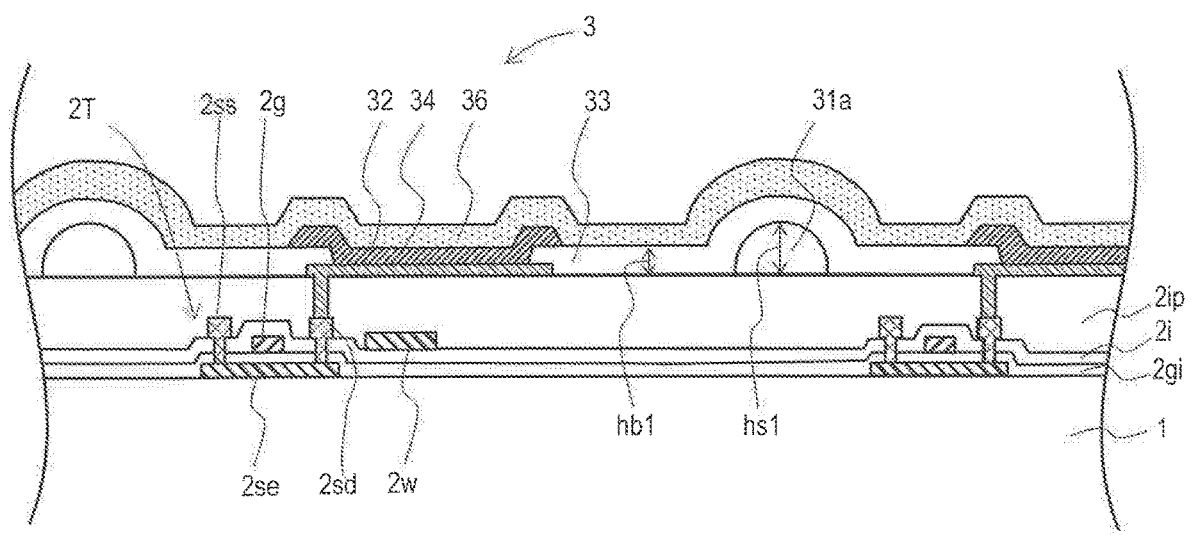
FIG. 5 corresponds to FIG. 4, and is a schematic cross-sectional view of an OLED display device in which the pixels are arranged in a striped array.

The OLED display device according to an embodiment of the present invention may be modified in any of various manners. For example, in the case where the pixels of the OLED display device are arranged in a striped array, the OLED display device may have, for example, a cross-sectional structure shown in FIG. 5. FIG. 5 corresponds to FIG. 4, and is a schematic cross-sectional view of an OLED display device in which the pixels are arranged in a striped array. The bank layer 33 may include a bank layer (striped) 33 covering the plurality of spacers 31 in a striped manner along the array of the pixels.

Figure 6:
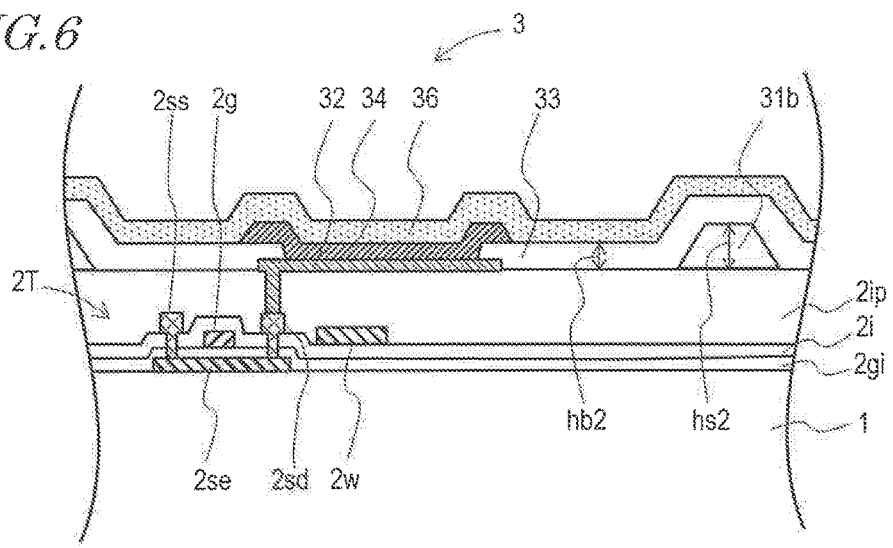
FIG. 6 corresponds to FIG. 4, and is a schematic cross-sectional view of an OLED display device in which the spacers each have a trapezoidal cross-section.
Figure 7:
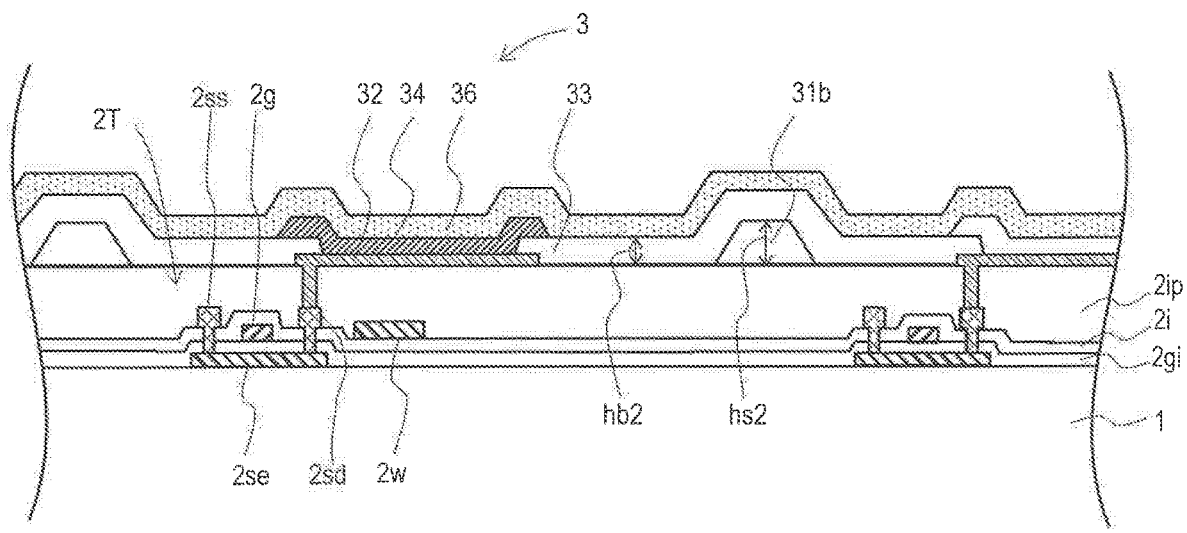
FIG. 7 corresponds to FIG. 6, and is a schematic cross-sectional view of an OLED display device in which the pixels are arranged in a striped array.

The cross-sectional shape of the spacer 31 is not limited to the semicircular shape described above, and may be varied when necessary. For example, as shown in FIG. 6 and FIG. 7, a spacer 31b may have a trapezoidal cross-sectional shape. FIG. 6 corresponds to FIG. 4, and is a schematic cross-sectional view of an OLED display device in which the spacers 31b each have a trapezoidal cross-sectional shape. FIG. 7 corresponds to FIG. 6, and is a schematic cross-sectional view of an OLED display device in which the pixels are arranged in a striped array.

Figure 8:
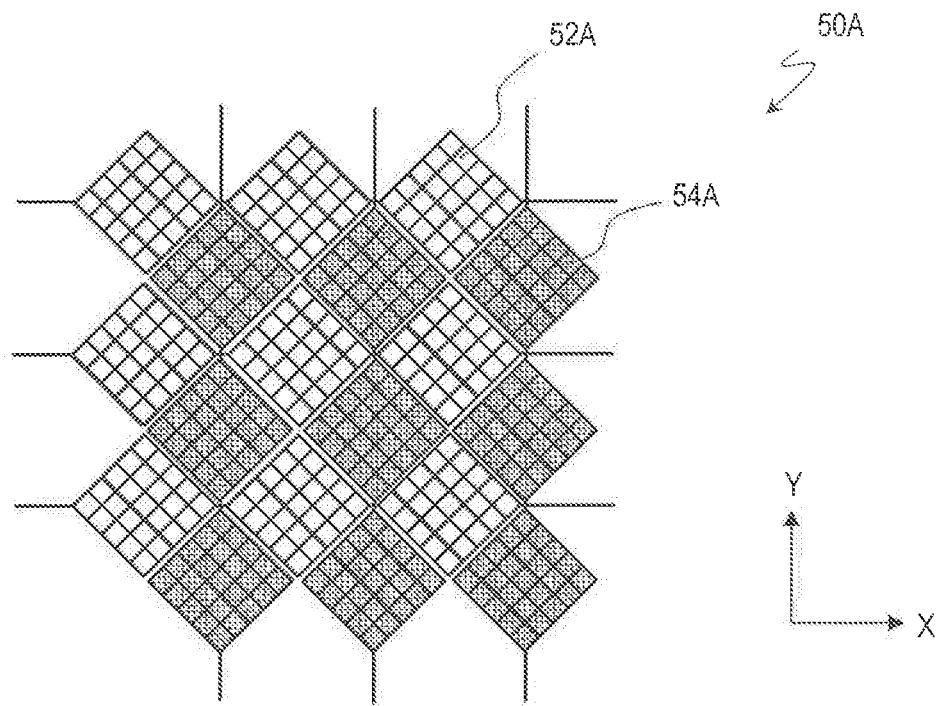
FIG. 8(a) and FIG. 8(b) are each a schematic view showing a structure of a touch sensor layer 50A that may be included in an OLED display device according to an embodiment of the present invention.
Figure 8:
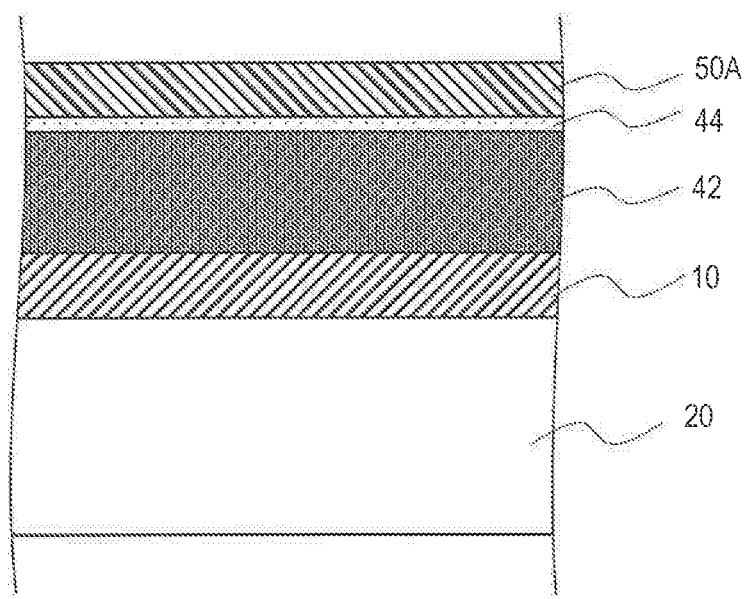
Figure 9:
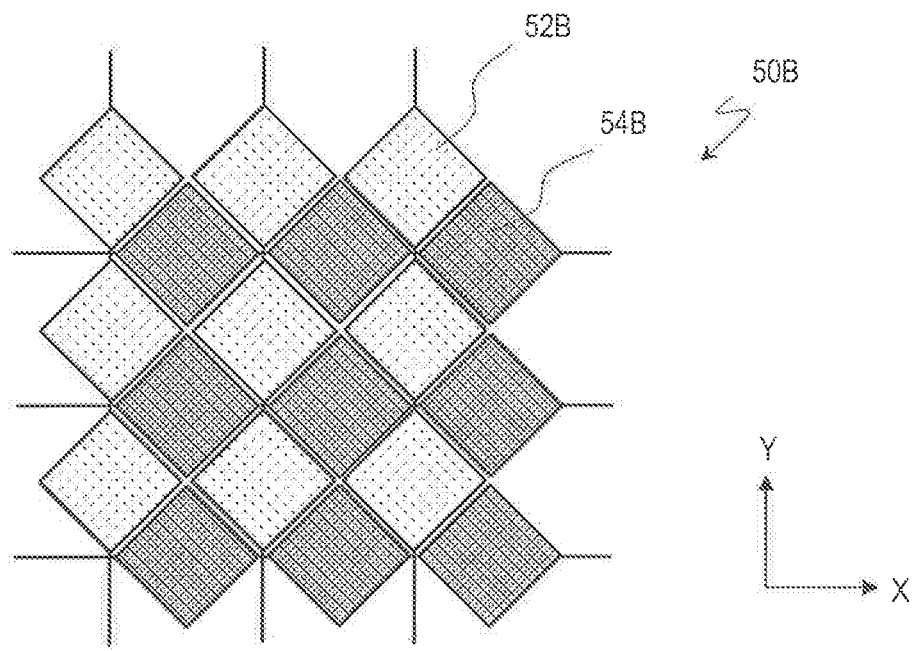
FIG. 9(a) and FIG. 9(b) are each a schematic view showing a structure of a touch sensor layer 50B that may be included in an OLED display device according to an embodiment of the present invention.
Figure 9:
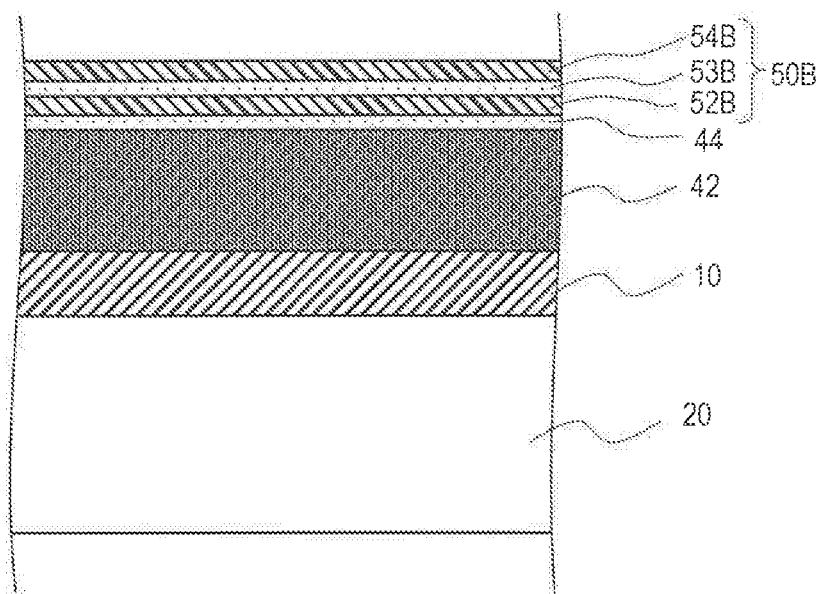

The touch sensor layer 50 included in the OLED display device according to an embodiment of the present invention may be a known touch sensor layer. The touch sensor layer 50 may be, for example, of a resistive film system or a projection-type electrostatic capacitive system. With reference to FIG. 8 and FIG. 9, a touch sensor layer 50A and a touch sensor layer 50B preferably usable for the OLED display device 100 will be described.

FIG. 8(a) is a schematic plan view of the touch sensor layer 50A, and FIG. 8(b) is a cross-sectional view of a portion including the touch sensor layer 50A. The touch sensor layer 50A is formed on the inorganic insulating layer 44 formed on the adhesive layer 42. The adhesive layer 42 is, for example, a pressure-sensitive adhesive layer.

The touch sensor layer 50A includes a plurality of X electrodes 52A extending in an X direction and a plurality of Y electrodes 54A extending in a Y direction perpendicular to the X direction. The X electrode 52A and the Y electrodes 54A are both formed of a metal mesh. A minimum unit of the metal mesh is, for example, a square having a size of 35 µm×35 µm. A plurality of such squares are assembled to form a square unit electrode having a size of, for example, 3 mm×3 mm. Such unit electrodes are connected in the X direction or the Y direction by wires. In a portion where the wires cross each other, the wires are insulated from each other by, for example, an inorganic insulating layer (SiN layer) (not shown). The metal mesh has, for example, a stack structure of a Ti layer and an Al layer, or a stack structure of Ti layer/Al layer/Ti layer.

FIG. 9(a) is a schematic plan view of the touch sensor layer 50B, and FIG. 9(b) is a cross-sectional view of a portion including the touch sensor layer 50B. The touch sensor layer 50B is formed on the inorganic insulating layer 44 formed on the adhesive layer 42. X electrodes 52B and Y electrodes 54B included in the touch sensor layer 50B are each formed of a transparent conductive layer (e.g., ITO layer), and are insulated from each other by an inorganic insulating layer (e.g., SiN layer) 53B. From the point of view of light transmittance, the touch sensor layer 50A is more advantageous.

In the case where the touch sensor layer includes a metal mesh layer as described above as an example, it is preferred that the circle equivalent diameter of each of the plurality of spacers 31 is shorter than the minimum unit of the metal mesh layer. Use of such a structure suppresses the sensitivity of the touch sensor from being declined, and/or suppresses the touch sensor from malfunctioning.

When the touch sensor 50 bonded by use of the adhesive layer 42 as in the OLED display device 100 is pressed by a finger, the adhesive layer 42, which is relatively flexible, is deformed, and the electrodes of the touch sensor layer 50 provides a top portion of the OLED 3 with a local strong external force via a thinned portion of the adhesive layer 42. As a result, the plurality of layers included in the organic EL element (e.g., the electrode and the organic layer, and/or the light emitting layer and the charge transfer layer included in the organic layer) may possibly be delaminated from each other. The OLED display device according to an embodiment of the present invention includes the spacers 31 having the above-described structure and the bank layer 33 covering the spacers 31, and therefore, effectively suppresses or prevents such delamination of layers.

Even in the case where the touch sensor layer is bonded by use of the adhesive layer 42 that is not flexible, unlike the pressure-sensitive adhesive layer, an external force applied to the OLED 3 via the adhesive layer 42 is dispersed by the spacers 31. The spacers 31 may be, for example, plastically deformed (buckled) by an external force to absorb the external force.

In order to produce the flexible OLED display device 100, for example, a polyimide film is formed on a support substrate (e.g., glass substrate), and the polyimide film on the support substrate is used as the substrate 1. An OLED display device including the touch sensor layer 50A or 50B described herein as an example is obtained by peeling off the polyimide film from the support substrate after the touch sensor layer 50A or 50B is formed.

For example, the adhesive layer 42 is provided on a touch sensor member including the touch sensor layer 50A or 50B and the inorganic insulating layer 44, and the resultant assembly is bonded to the element substrate on which the TFE structure 10 is formed. Then, the polyimide film is peeled off from the support substrate.

INDUSTRIAL APPLICABILITY

An embodiment of the present invention is preferably usable for an organic EL display device, specifically, a flexible organic EL display device, and a method for producing the same.

REFERENCE SIGNS LIST

1: flexible substrate; 2: backplane (circuit); 3: organic EL element; 4: polarizing plate; 10: thin film encapsulation structure (TFE structure); 12: first inorganic barrier layer; 14: organic barrier layer; 16: second inorganic barrier layer; 31: spacer; 32: bottom electrode; 33: bank layer; 34: organic layer (organic EL layer); 36: top electrode; 100: organic EL display device

The invention claimed is:

1. An organic electroluminescent display device including a plurality of pixels, the organic electroluminescent display device comprising:
   an element substrate including a substrate, and a plurality of organic electroluminescent elements supported by the substrate and respectively located in the plurality of pixels; and
   a thin film encapsulation structure covering the plurality of pixels,
   wherein the thin film encapsulation structure includes a first inorganic barrier layer and an organic barrier layer in contact with a top surface or a bottom surface of the first inorganic barrier layer,
   wherein the element substrate further includes a bank layer defining each of the plurality of pixels, and a plurality of spacers located in gaps between the plurality of pixels,
   wherein the plurality of spacers are covered with the bank layer, and
   wherein the plurality of spacers are located at a higher density in a peripheral display region in a display region, in which the plurality of pixels are arrayed, than in a central display region in the display region.

2. The organic electroluminescent display device of claim 1, wherein the plurality of spacers are located in the peripheral display region at a density that is at least twice the density in the central display region.

3. The organic electroluminescent display device of claim 1, wherein the plurality of spacers have a height greater than a thickness of the bank layer.

4. The organic electroluminescent display device of claim 1, wherein the plurality of spacers each have a circle equivalent diameter of 5 μm or greater and 30 μm or less as seen in a direction of normal to the substrate.

5. The organic electroluminescent display device of claim 1, wherein the organic barrier layer included in the thin film encapsulation structure is in contact with the top surface of the first inorganic barrier layer and includes a plurality of solid portions discretely distributed, and the thin film encapsulation structure further includes a second inorganic barrier layer in contact with the top surface of the first inorganic barrier layer and top surfaces of the plurality of solid portions of the organic barrier layer.

6. The organic electroluminescent display device of claim 1, wherein the organic barrier layer included in the thin film encapsulation structure is in contact with the bottom surface of the first inorganic barrier layer and acts also as a flattening layer having a thickness of 5 μm or greater.

7. The organic electroluminescent display device of claim 1, further comprising a touch sensor layer provided on the thin film encapsulation structure.

8. The organic electroluminescent display device of claim 7, wherein the touch sensor layer includes a metal mesh layer, and the plurality of spacers each have a circle equivalent diameter that is shorter than a minimum unit of the metal mesh layer.

9. The organic electroluminescent display device of claim 1, wherein the substrate is a flexible substrate.

10. The organic electroluminescent display device of claim 1, wherein the peripheral display region has a width that is 5% or greater and 15% or less of a length of the display region in a corresponding direction.

11. The organic electroluminescent display device of claim 1, wherein the plurality of pixels are arrayed in a number of 50 or larger and 200 or smaller in a width direction of the peripheral display region.

12. A method for producing the organic electroluminescent display device of claim 1, the method comprising:
   step A of forming the plurality of spacers of a photocurable resin;
   a step of: after the step A, providing a liquid-state photosensitive resin material such that the liquid-state photosensitive resin material covers the plurality of spacers; and
   a step of patterning the photosensitive resin material by a photolithography pattern to form the hank layer.

13. The method of claim 12, wherein the photosensitive resin material contains an acrylic resin or a polyamide resin.

* * * * *